(12) United States Patent
Madni et al.

(10) Patent No.: US 6,278,299 B1
(45) Date of Patent: Aug. 21, 2001

(54) VOLTAGE TO CURRENT CONVERTER

(75) Inventors: Arshad Madni, Swindon; Nicholas P Cowley, Wroughton, both of (GB)

(73) Assignee: Mitel Semiconductor Limited (GB)

( * ) Notice: Subject to any disclaimer, the term of this patent is extended or adjusted under 35 U.S.C. 154(b) by 0 days.

(21) Appl. No.: 09/479,973

(22) Filed: Jan. 10, 2000

(30) Foreign Application Priority Data

Jan. 9, 1999 (GB) ................................................. 9900344

(51) Int. Cl.⁷ .................................................. H02M 11/00
(52) U.S. Cl. .............................................. 327/103; 327/65
(58) Field of Search ................................. 327/52, 65, 103, 327/563, 72

(56) References Cited

U.S. PATENT DOCUMENTS

| | | | |
|---|---|---|---|
| 4,379,345 | * | 4/1983 | Uri ............................................ 327/55 |
| 5,523,717 | * | 6/1996 | Kimura ..................................... 327/327 |
| 5,552,729 | * | 9/1996 | Deguchi .................................... 327/103 |
| 5,714,906 | * | 2/1998 | Motamed et al. ......................... 327/563 |
| 5,804,994 | * | 9/1998 | Marlow et al. ............................ 327/67 |
| 5,892,382 | * | 4/1999 | Ueda et al. ................................ 327/202 |
| 5,963,064 | * | 10/1999 | Toyota et al. ............................. 327/103 |

\* cited by examiner

*Primary Examiner*—Terry D. Cunningham
(74) *Attorney, Agent, or Firm*—Kirschstein, et al.

(57) ABSTRACT

A voltage to current converter comprises a first long tail pair comprising transistors whose emitters are connected via equal value resistors to a constant current source. The first long tail pair forms a main transconductance stage. A subsidiary or corrector transconductance stage is connected in anti-phase with the main stage. The corrector stage is based on another long tail pair comprising transistors whose emitters are connected via resistors to another constant current source. The linear part of the transconductance of the corrector stage is substantially less than that of the main stage but the non-linear part is substantially equal to that of the main stage. Thus, non-linear distortion can be substantially reduced.

9 Claims, 3 Drawing Sheets

US 6,278,299 B1

VOLTAGE TO CURRENT CONVERTER

BACKGROUND OF THE INVENTION

1. Field of the Invention

The present invention relates to a voltage to current converter. Such a converter has many applications, for example in low noise amplifier (LNA), mixer and automatic gain control (AGC) applications.

2. Description of the Prior Art

FIG. 1 of the accompanying drawings illustrates a known type of voltage to current converter or "transconductor amplifier" which is based on a long tail pair of active devices shown as first and second npn transistors T1 and T2. The emitters of the transistors T1 and T2 are connected via resistors R1 and R2, respectively, to one terminal of a tail current source in the form of a constant current source CC1 whose other terminal is connected to ground gnd. The collectors of the transistors T1 and T2 form differential current outputs OUT1 and OUT2, respectively, of the converter. The bases of the transistors T1 and T2 are connected to differential input terminals IN1 and IN2, respectively, and via resistors R5 and R6 to a bias voltage source BS.

For relatively low differential input voltages to the converter shown in FIG. 1, the transconductance is substantially linear so that the differential output current is substantially proportional to the differential input voltage. However, the transconductance is not in fact linear but includes non-linear terms which give rise to distortion. The principal non-linearity in the transconductance is of third order or cubic form and the transconductance gm may be written as:

$$gm = gm1.v + \alpha.v^3 \quad (1)$$

where gm1 is the small signal transconductance, v is the differential input voltage and $\alpha$ is a constant.

BASIC CONCEPT OF THE INVENTION

According to the invention, there is provided a voltage to current converter comprising: a first long tail pair comprising first and second active devices of a first conduction type and a first tail current source, each of the first and second active devices having an output terminal, a control terminal and a common terminal; and a second long tail pair comprising third and fourth active devices of a second conduction type opposite the first conduction type and a second tail current source, the third active device having a control terminal connected to the control terminal of the first active device and an output terminal connected to the common terminal of the second active device, the fourth active device having a control terminal connected to the control terminal of the second active device and an output terminal connected to the common terminal of the first active device.

The common terminals of the first and second active devices may be connected via first and second resistors, respectively, of substantially equal first value to the first tail current source.

The first tail current source may comprise a first constant current source.

The third and fourth active devices may have common terminals connected via third and fourth resistors, respectively, of substantially equal second value to the second tail current source. The second value may be greater than the first value. The second value may be substantially between four and five times the first value.

The second tail current source may comprise a second constant current source.

The tail current of the first long tail pair may be greater than the tail current of the second long tail pair. The tail current of the first long tail pair may be substantially ten times the tail current of the second long tail pair.

Each of the first to fourth active devices may comprise a bipolar transistor whose output, control and common terminals comprise collector, base and emitter electrodes, respectively.

Each of the first to fourth active devices may comprise a field effect transistor whose output, control and common terminals comprise drain, gate and source electrodes, respectively.

It has been found that the non-linear terms of the transconductance, such as the cubic term, can be substantially cancelled or greatly reduced by connecting a second transconductance stage in anti-phase with a first main stage. The second or "corrector" transconductance stage can be made to dissipate substantially less power than the main stage and, from a noise point of view, is connected in parallel with the main stage. The transconductance of the main stage is substantially greater than that of the corrector stage so that the main transconductance stage remains the dominant noise source and the noise performance is not, therefore, substantially degraded.

It is therefore possible to provide a voltage to current converter having substantially improved linearity without substantially or unacceptably degrading other aspects of performance such as power dissipation and noise performance. This can be achieved by the addition of only a relatively small number of components to the converter so that the cost penalty is insignificant.

BRIEF DESCRIPTION OF THE DRAWINGS

The invention will be further described, by way of example, with reference to the accompanying drawings, in which.

Like reference numerals refer to like parts throughout the drawings.

DESCRIPTION OF THE PREFERRED EMBODIMENTS

Figure 1:
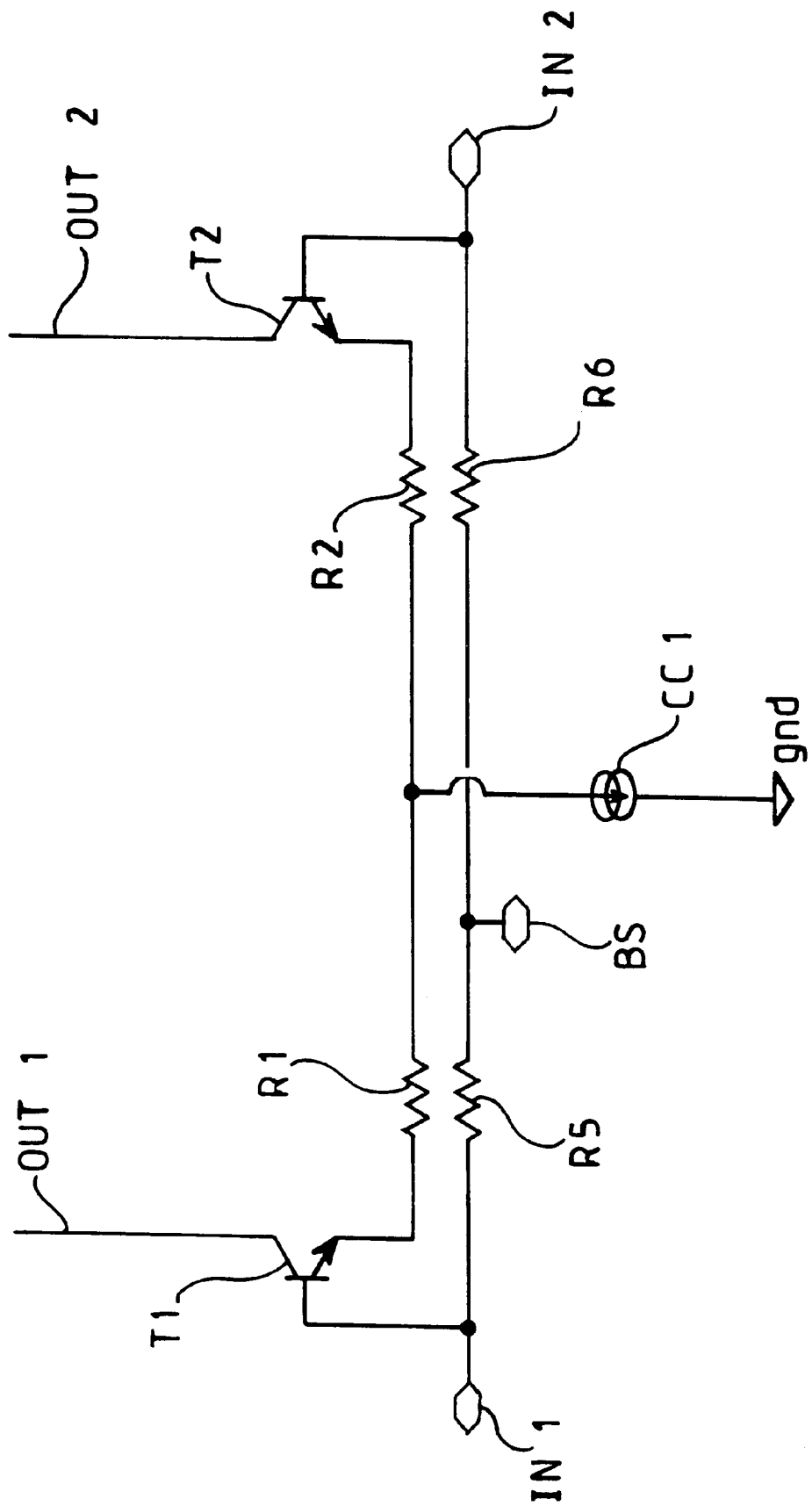
FIG. 1 is a circuit diagram of a known voltage to current converter.
Figure 2:
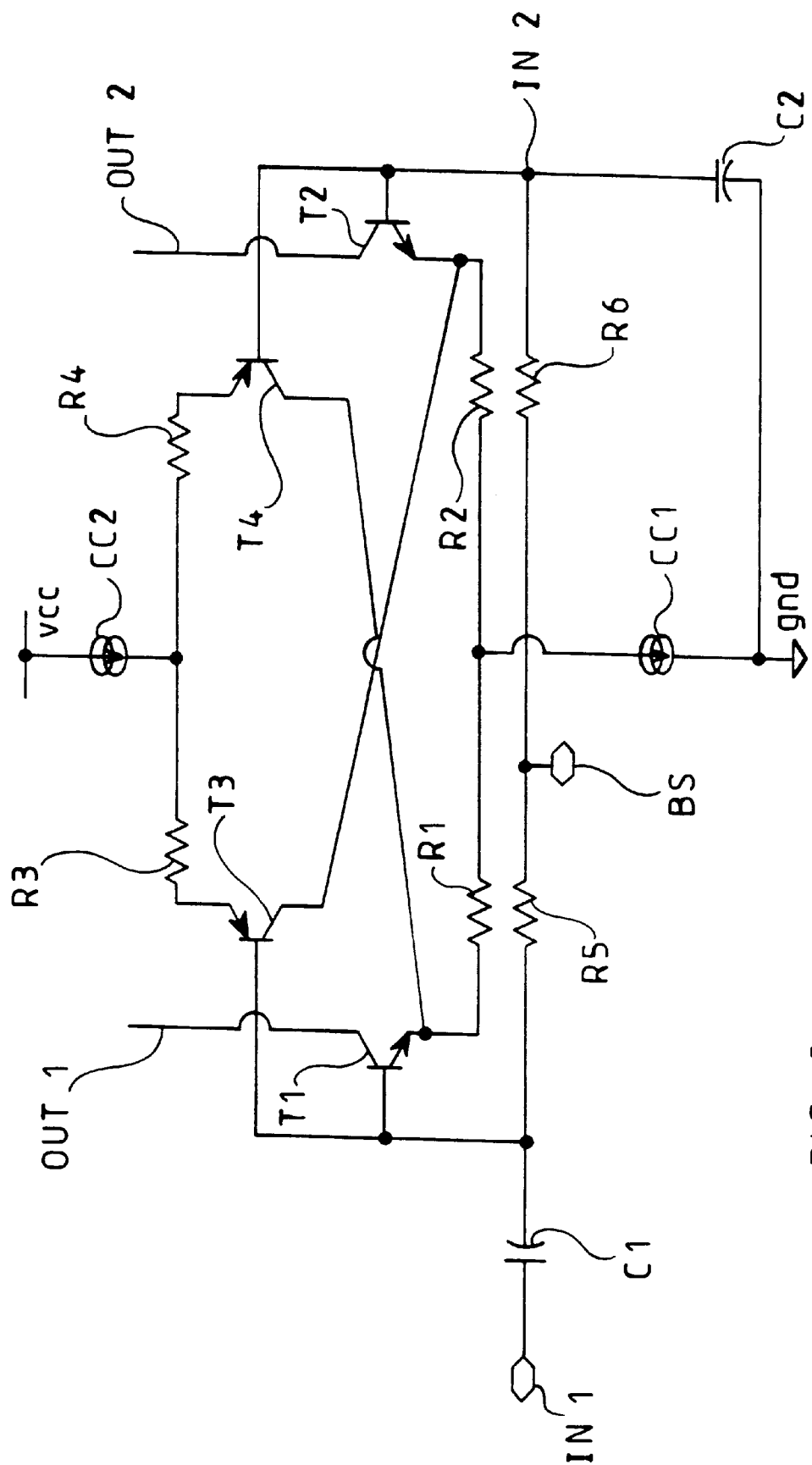
FIG. 2 is a circuit diagram of a voltage to current converter constituting an embodiment of the invention.

The converter shown in FIG. 2 is based on the known type of converter shown in FIG. 1 in that it comprises a transconductance main stage in the form of a long tail pair comprising transistors T1 and T2, emitter resistors R1 and R2 of the same value, a constant current source CC1, and resistors R5 and R6 for biasing the transistors T1 and T2 from a bias voltage source BS. This stage is substantially identical to the converter shown in FIG. 1 and operates in the same way. In particular, the transconductance is subject to the same non-linearity and may be expressed, at least to a second order of approximation, by expression (1).

The converter of FIG. 2 comprises a subsidiary or corrector transconductance stage which is also of the long tail pair type but which is connected in anti-phase with the first stage. The corrector stage comprises third and fourth pnp transistors T3 and T4 whose emitters are connected via resistors R3 and R4, respectively, to one terminal of a second constant current source CC2, whose other terminal is connected to a supply line vcc. The base of the transistor T3 is connected to the base of the transistor T1 whereas the base of the transistor T4 is connected to the base of the transistor T2. The collector of the transistor T3 is connected to the emitter of the transistor T2 whereas the collector of the transistor T4 is connected to the emitter of the transistor T1. The corrector stage thus receives the same differential input signal as the main stage but the differential output currents are supplied in anti-phase through the resistors R1 and R2.

The resistors R3 and R4 are of the same value and, in combination with the current supplied by the constant current source CC2, are such that the transconductance of the corrector stage comprises a linear term, which is substantially smaller than the linear term of the transconductance of the main stage, and distortion terms, such as the third order or cubic distortion term, which are substantially equal to the distortion term or terms in the transconductance of the main stage. Typically, the value of each of the resistors R3 and R4 is between four and five times higher than the value of the resistors R1 and R2. Also typically, the current supplied by the first constant current source CC1 is substantially ten times higher than the current supplied by the second constant current source CC2. However, these values may be readily selected or adjusted by a man skilled in the art, for instance using simulation techniques, so as to minimise non-linear distortion.

Although the embodiment shown in FIG. 2 is based on bipolar junction transistors, any other active devices may be used, such as field effect transistors CMOS devices and gallium arsenide devices. In the case of field effect transistors or other "square law" transfer function devices, the third order or cubic term is already relatively small. However, this technique may be used to provide significant improvement to linearity with little or no significant penalty in terms of power consumption and noise performance.

Figure 3:
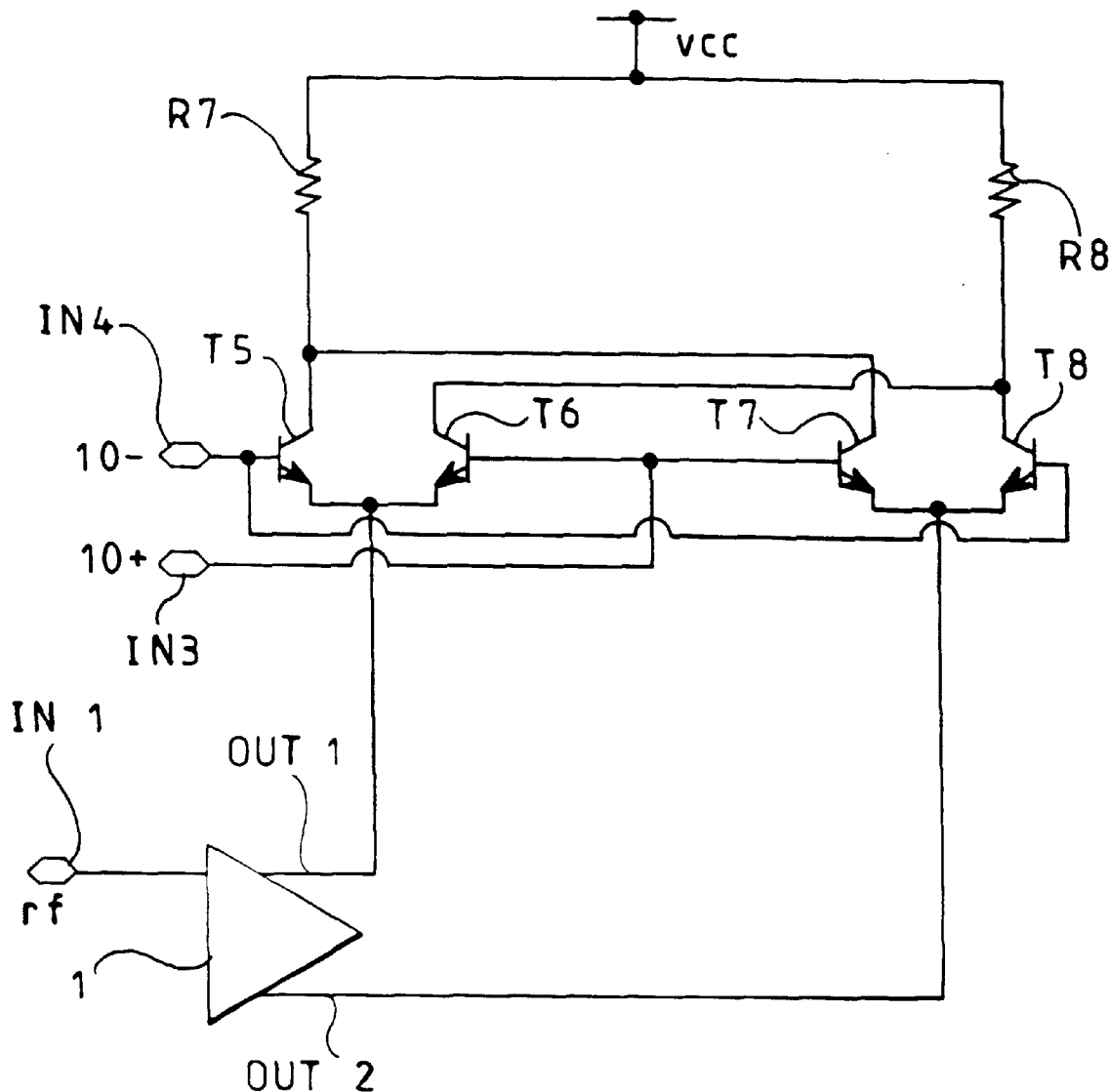
FIG. 3 is a circuit diagram illustrating an application of the converter of FIG. 2 in a mixer stage of a superheterodyne receiver.

The converter shown in FIG. 2 has many applications, only one of which is illustrated in FIG. 3 purely by way of example. The converter is connected for single-ended inputs as shown in FIG. 2. Thus, the input IN2 is grounded for AC signals by a capacitor C2 whereas the other input IN1 has a coupling capacitor C1 for blocking DC. As shown in FIG. 3, the outputs OUT1 and OUT2 are connected to a frequency changer or mixer of the Gilbert type for changing the frequency of an input signal rf by superheterodyning with the differential output signal lo−, lo+ of a local oscillator.

The mixer comprises transistors T5 and T6 connected as a long tail pair with the tail current being supplied by the output OUT1 of the converter 1. A further long tail pair comprising transistors T7 and T8 likewise has its tail current supplied by the output OUT2 of the converter 1. The bases of the transistors T6 and T7 are connected to an input IN3 whereas the bases of the transistors T5 and T8 are connected to an input IN4. The collectors of the transistors T5 and T7 are connected via a load resistor R7 to the supply line vcc whereas the collectors of the transistors T6 and T8 are connected to the supply line vcc via a load resistor R8. The outputs of the mixer are developed across the load resistors R7 and R8. Thus, if a balanced or differential output signal is required, this may be taken across both resistors R7 and R8. Alternatively, if a single-ended or unbalanced output is required, this may be taken across either of the resistors R7 and R8.

In the case of the mixer shown in FIG. 3, the improvement in linearity provides a purer output signal from the mixer. For instance, the reduction in or absence of third order distortion terms reduces or substantially eliminates third harmonic distortion components in the mixer output.

Substantially the same circuit arrangement as shown in FIG. 3 may also be used to provide gain control, for instance, in a radio receiver. For example, an intermediate frequency (IF) amplifier stage may have the form shown in FIG. 3. In this case, the transistors T5 to T8 act as the amplifier stage and the converter 1 receives the automatic gain control voltage so as to control the gain of the amplifier.

What is claimed is:

1. A voltage to current converter comprising:
   a) a first long tail pair comprising first and second active devices of a first conduction type and a first tail current source,
      i) said first active device having an output terminal forming a first output of said converter, a control terminal forming a first input of said converter, and a common terminal,
      ii) said second active device having an output terminal forming a second output of said converter, a control terminal forming a second input of said converter, and a common terminal;
   b) a second long tail pair comprising third and fourth active devices of a second conduction type opposite said first conduction type and a second tail current source,
      i) said third active device having a control terminal connected to said control terminal of said first active device and an output terminal connected to said common terminal of said second active device,
      ii) said fourth active device having a control terminal connected to said control terminal of said second active device and an output terminal connected to said common terminal of said first active device; and
   c) said common terminals of said first and second active devices being connected via first and second resistors, respectively, of substantially equal first value to said first tail current source.

2. A converter as claimed in claim 1, in which said first tail current source comprises a first constant current source.

3. A converter as claimed in claim 1, in which said third and fourth active devices have common terminals connected via third and fourth resistors, respectively, of substantially equal second value to said second tail current source.

4. A converter as claimed in claim 3, in which said second value is greater than said first value.

5. A converter as claimed in claim 4, in which said second value is substantially between four and five times said first value.

6. A converter as claimed in claim 1, in which said second tail current source comprises a second constant current source.

7. A converter as claimed in claim 1, in which a tail current of said first long tail pair is greater than a tail current of said second long tail pair.

8. A converter as claimed in claim 7, in which said tail current of said first long tail pair is substantially ten times said tail current of said second long tail pair.

9. A converter as claimed in claim 1, in which each of said first to fourth active devices comprises a bipolar transistor whose output, control and common terminals comprise collector, base and emitter electrodes, respectively.

* * * * *